US009947680B2

(12) United States Patent
Utsumi (10) Patent No.: US 9,947,680 B2
(45) Date of Patent: Apr. 17, 2018

(54) SEMICONDUCTOR MEMORY DEVICE (71) Applicant: Toshiba Memory Corporation, Minato-ku (JP)

(72) Inventor: Tetsuaki Utsumi, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/459,489

(22) Filed: Mar. 15, 2017

(65) Prior Publication Data
US 2018/0083020 A1    Mar. 22, 2018

Related U.S. Application Data

(60) Provisional application No. 62/395,723, filed on Sep. 16, 2016.

(51) Int. Cl.
| *H01L 27/11548* | (2017.01) |
| *H01L 27/11524* | (2017.01) |
| *H01L 23/528* | (2006.01) |
| *H01L 23/522* | (2006.01) |

(52) U.S. Cl.
CPC ...... *H01L 27/11548* (2013.01); *H01L 23/528* (2013.01); *H01L 23/5223* (2013.01); *H01L 27/11524* (2013.01)

(58) Field of Classification Search
CPC ............. H01L 27/11524; H01L 23/528; H01L 23/5223; H01L 27/11548
See application file for complete search history.

(56) References Cited

U.S. PATENT DOCUMENTS

| 6,649,945 | B1 | 11/2003 | Hosono et al. |
| 8,243,524 | B2 * | 8/2012 | Suzuki ..................... G11C 8/10 365/185.2 |
| 8,865,589 | B2 * | 10/2014 | Hashimoto ........... H01L 23/528 438/637 |
| 9,281,272 | B2 * | 3/2016 | Watanabe ........... H01L 23/5223 |

(Continued)

FOREIGN PATENT DOCUMENTS

| JP | 2004-79857 | 3/2004 |
| JP | 2005-166248 | 6/2005 |

(Continued)

*Primary Examiner* — Jarrett Stark
*Assistant Examiner* — Charles N Ausar-El
(74) *Attorney, Agent, or Firm* — Oblon, McClelland, Maier & Neustadt, L.L.P.

(57) ABSTRACT

A semiconductor memory device includes first wires extending in a first direction; second wires provided in a first interconnect layer including the first wires, the second wires extending in the first direction along extension lines of the first wires respectively; third wires provided in a second interconnect layer different from the first interconnect layer; and transistors on/off controlling electrical connections between the first wires and the second wires through the third wires. The first and second wires are arranged respectively in a second direction crossing the first direction. The transistors are disposed in M stages (M is integer not less than 2) in the first direction, the M stages each including a transistor array aligned in the second direction. The first second wires are periodically arranged with the minimum period including M times N first wires (N is integer not less than 2) and M times N second wires.

19 Claims, 6 Drawing Sheets

(56) References Cited

U.S. PATENT DOCUMENTS

| | | | |
|---|---|---|---|
| 9,437,588 B1* | 9/2016 | Zeng | H01L 27/0207 |
| 9,449,966 B2* | 9/2016 | Chen | H01L 27/0688 |
| 9,773,845 B2* | 9/2017 | Murooka | H01L 27/249 |
| 2001/0043483 A1* | 11/2001 | Yang | G11C 5/02 365/51 |
| 2005/0117378 A1 | 6/2005 | Cho et al. | |
| 2009/0034336 A1 | 2/2009 | Kwak et al. | |
| 2011/0134695 A1 | 6/2011 | Kanda et al. | |
| 2011/0175159 A1* | 7/2011 | Itagaki | G11C 5/02 257/326 |
| 2011/0182099 A1* | 7/2011 | Kim | G11C 5/063 365/51 |
| 2012/0081958 A1* | 4/2012 | Lee | G11C 16/0483 365/185.05 |
| 2013/0105983 A1* | 5/2013 | Min | H01L 27/0203 257/773 |
| 2015/0187418 A1* | 7/2015 | Tsai | G11C 13/0097 365/63 |
| 2015/0187422 A1* | 7/2015 | Aritome | G11C 5/02 365/185.17 |
| 2015/0243598 A1* | 8/2015 | Zhong | H01L 21/76892 257/773 |
| 2016/0118343 A1* | 4/2016 | Tsunemine | H01L 23/5283 257/532 |
| 2016/0126180 A1* | 5/2016 | Meng | H01L 23/528 257/774 |
| 2016/0133300 A1* | 5/2016 | Pellizzer | H01L 21/768 257/773 |
| 2016/0276265 A1* | 9/2016 | Iwabuchi | H01L 23/5223 |
| 2017/0033158 A1* | 2/2017 | Vereen | H01L 45/08 |
| 2017/0243818 A1* | 8/2017 | Aburada | H01L 23/528 |

FOREIGN PATENT DOCUMENTS

| | | |
|---|---|---|
| JP | 2009-38382 | 2/2009 |
| JP | 2011-119530 | 6/2011 |

* cited by examiner

SEMICONDUCTOR MEMORY DEVICE

CROSS-REFERENCE TO RELATED APPLICATIONS

This application is based upon and claims the benefit of priority from U.S. Provisional Patent Application 62/395,723 filed on Sep. 16, 2016; the entire contents of which are incorporated herein by reference.

FIELD

Embodiments are generally related to a semiconductor memory device.

BACKGROUND

There is a semiconductor memory device, in which high voltage is applied to memory cells during data erasing. In a NAND type flash memory device, for example, high voltage is applied to channels of memory cells via bit lines. In such a device, high-voltage transistors used for cutting off the bit lines are disposed to protect a peripheral circuit such as a sense amplifier and like, which is electrically connected to the memory cells via the bit lines. The high-voltage transistors, however, have a size larger than an arrangement pitch of bit lines, and thus, it becomes possible to connect the bit lines to the high-voltage transistors by making a layout with positional shifts of the high-voltage transistors in an extending direction of the bit lines.

DETAILED DESCRIPTION

According to one embodiment, a semiconductor memory device includes a plurality of semiconductor channel bodies; a plurality of memory cells disposed along each of the semiconductor channel bodies; a plurality of first wires electrically connected to the semiconductor channel bodies respectively, and extending in a first direction; a plurality of second wires provided at a first interconnect layer including the first wires, the second wires being electrically connected to a first circuit driving the memory cells, and extending in the first direction along extension lines of the first wires respectively; a plurality of third wires provided in a second interconnect layer different from the first interconnect layer, the third wires being electrically connected to the first wires or the second wires respectively; and a plurality of transistors on/off controlling electrical connections between the first wires and the second wires through the third wires. The first wires and the second wires are arranged respectively in a second direction crossing the first direction. The transistors are disposed in an arrangement including M stages (M is integer not less than 2) in the first direction, the M stages each including a transistor array aligned in the second direction. The first wires and the second wires are disposed respectively in a periodic arrangement, the minimum period of the periodic arrangement including M times N first wires (N is integer not less than 2) and M times N second wires. The M times N first wires and the M times N second wires are connected to a transistor group including N transistors in the transistor array in each of the M stages.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Figure 1:
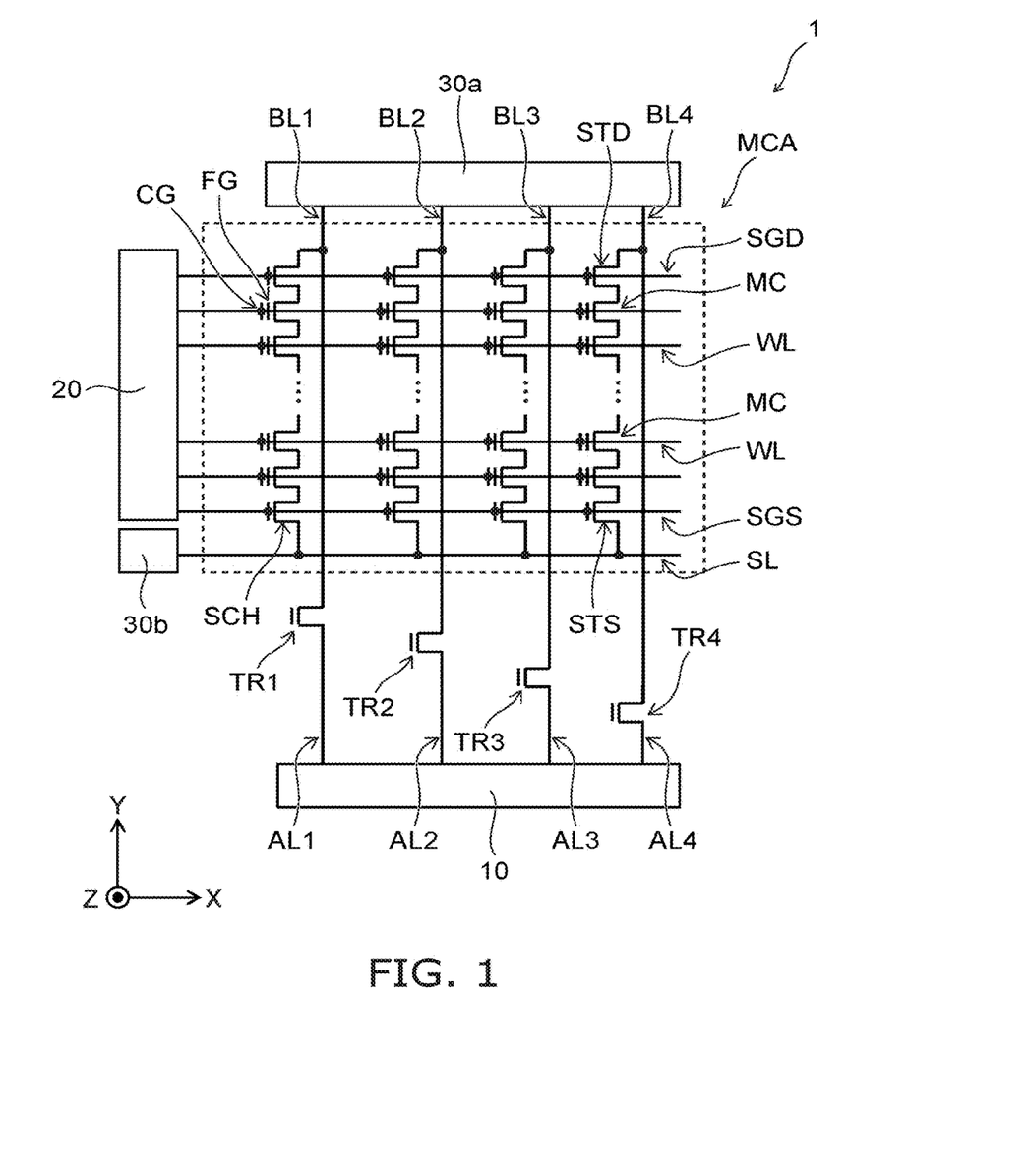
FIG. 1 is a schematic view showing a semiconductor memory device according to an embodiment.

FIG. 1 is a schematic view showing a semiconductor memory device 1 according to an embodiment. The semiconductor memory device 1 is, for example, a NAND type flash memory device, and includes a memory cell array MCA, a sense amplifier 10, a row decoder 20, bias control units 30a and 30b. The sense amplifier 10, the row decoder 20, the bias control units 30a and 30b are disposed around the memory cell array MCA.

The memory cell array MCA includes, for example, a plurality of memory cells MC, selection transistors STD and STS, which are arranged along a semiconductor channel body SCH. The memory cells MC each include, for example, a floating gate FG and a control gate CG, which are provided on the semiconductor channel body SCH.

An end of the semiconductor channel body SCH on a drain side is electrically connected to a bit line BL. Moreover, an end of the semiconductor channel body SCH on a source side is electrically connected to a source line SL. Hereinbelow, there are cases where bit lines BL1 to BLn (here, n is a positive integer) are referred individually, or referred collectively to as "bit lines BL". Other elements are also referred in the same manner.

The sense amplifier 10 is electrically connected to the semiconductor channel body SCH via the bit line BL, and reads data out, which are stored in the memory cells MC, for example, by detecting cell current flowing through the semiconductor channel body SCH.

The row decoder 20 controls gate bias voltages of the memory cells MC, the selection transistors STD and STS through word lines WL, selection gates SGS and SGD. The word lines WL act as control gates of the memory cells MC, and the selection gates SGS and SGD act as gate electrodes of the selection transistors STS and STD respectively.

The bias control units 30a and 30b control electric potentials of the bit lines BL and the source line SL respectively. That is, the bias control units 30a and 30b supply the electric potentials to the bit lines BL and the source line SL respectively corresponding to operation modes of the memory cell array MCA such as data writing, data erasing and data reading.

The semiconductor memory device 1 further includes transistors TR1 to TR4 disposed between the memory cell array MCA and the sense amplifier 10. The transistors TR1 to TR4 each are interposed between a bit line BL and a circuit side wire AL that is connected to the sense amplifier 10, and perform on/off control of the electrical connection therebetween.

The transistors TR1 to TR4 are of high voltage type, and are set to be off-state when applying high electric potential to bit lines BL, for example, in order to erase data in memory cells MC. Thereby, the electrical potential of the bit lines BL are interrupted, and the sense amplifier 10 is protected. Moreover, the transistors TR1 to TR4 are set to be on-state when reading data out from the memory cells MC.

Figure 2A:
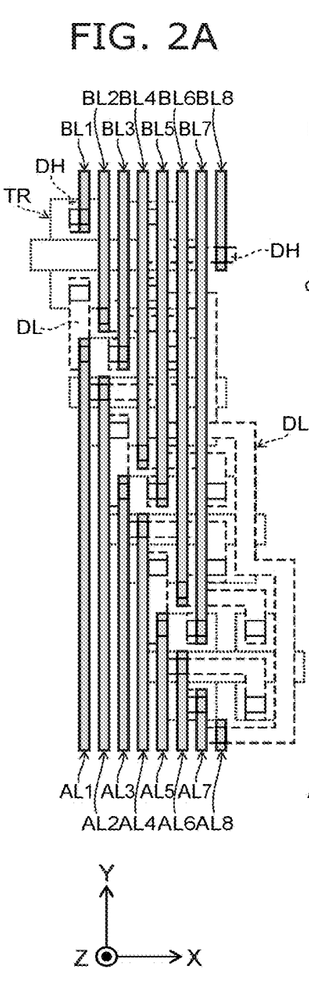
FIGS. 2A to 2C are schematic views showing a connection method of bit lines and circuit side wires according to the embodiment.
Figure 2B:
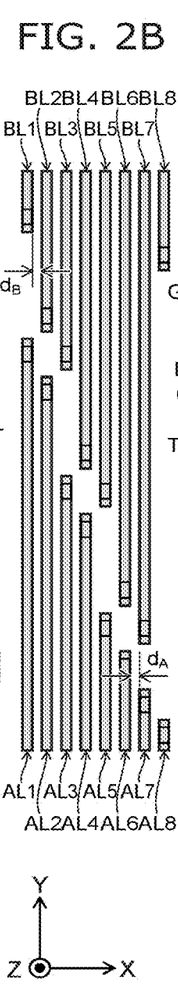
Figure 2C:
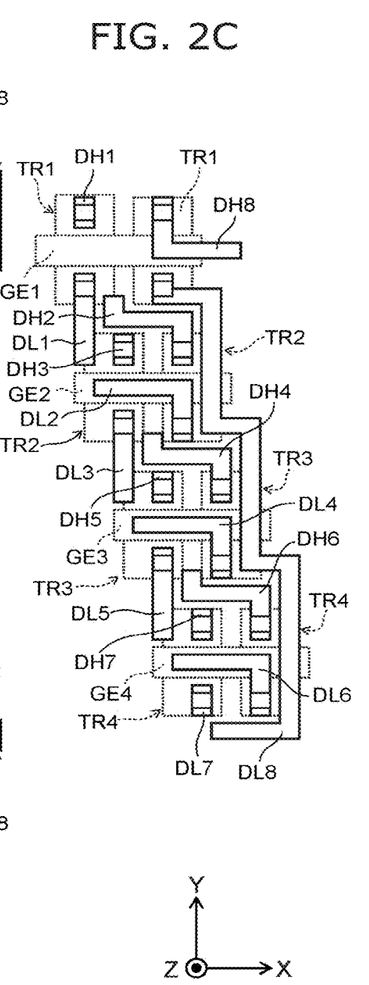

Hereinafter, a connection manner of bit lines BL and circuit side wires AL is described with reference to FIGS. 2A to 2C. FIG. 2A is a schematic views showing the bit lines BL and the circuit side wires AL, which are connected via transistors TR. FIG. 2B is a schematic view showing the bit lines BL and the circuit side wires AL. FIG. 2C is a schematic view showing lower layer wires DH, DL and the transistors TR.

FIG. 2A shows the multi-layer wire provided on the transistors TR. For example, a first interconnect layer includes the bit lines BL and the circuit side wires AL, and a second interconnect layer includes the lower layer wires DH and DL. The second interconnect layer is positioned at a level between the first interconnect layer and the transistors TR. The lower layer wires DH are connected to the transistors TR respectively on a drain side, and the lower layer wires DL are connected to the transistors respectively on a source side. The bit lines BL and the circuit side wires AL are electrically connected at each end portion thereof to a lower layer wire DH or a lower layer wire DL, which is positioned therebelow.

It should be noted that the embodiment are not limited to this example. For example, multiple intermediate interconnect layers may be included between the first interconnect layer and the transistors TR, and the bit lines BL and the circuit side wires AL are electrically connected via the multiple intermediate interconnect layers.

As shown in FIG. 2B, the circuit side wires AL1 to AL8 are disposed on extension lines (not shown) in the Y-direction of the bit lies BL1 to BL8 respectively. Thus, the bit lines BL1 to BL8 and the circuit side wires AL1 and AL8 are arranged respectively in the X-direction with the same pitch. For example, a distance $d_B$ between adjacent bit lines BL is the same as a distance $d_A$ between circuit side wires AL, which is the minimum distance between the wires. Moreover, a bit line BL and a circuit side wire AL adjacent to each other are disposed such that a distance between the bit line BL and the circuit side wire AL is wider than the minimum distance.

As shown in FIG. 2C, two transistors TR1 are arranged in the X-direction. Moreover, the two transistors TR1 share one gate electrode GE. Other transistors TR2 to TR4 are also arranged in the same manner. That is, in this example, the transistors TR arranged in the X-direction are disposed in the four stages along the Y-direction.

For example, the bit line BL1 and the circuit side wire AL1 are electrically connected to a transistor TR1 through the lower layer wires DH1 and DL1. The bit line BL2 and the circuit side wire AL2 are electrically connected to a transistor TR2 through the lower layer wires DH2 and DL2. The bit line BL3 and the circuit side wire AL3 are electrically connected to another transistor TR2 through the lower layer wires DH3 and DL3. Moreover, the bit lines BL4 to BL7 and the circuit side wires AL4 to AL7 are also connected in the same manner. A pair of the bit lines BL2 and BL3, a pair of the bit lines BL4 and BL5 and a pair of the bit lines BL6 and BL7 are connected respectively via the transistors TR disposed in the same stage to the circuit side wires AL.

Furthermore, the bit line BL8 and the circuit side wire AL8 are electrically connected to another transistor TR1 through the lower layer wires DH8 and DL8. As shown in FIG. 2B, a distance between the bit line BL8 and the circuit side wire AL8 is wider than a distance between other bit line BL and other circuit side wire AL. Thus, the lower layer wire DL8, which connects the circuit side wire AL8 to another transistor TR1 on the source side, is longer than other lower layer wires DH and DL. That is, the lower layer wire DL8 has the longest length in the lower layer wires DH1 to DH8 and DL1 to DL8.

The semiconductor memory device 1 further includes a plurality of bit lines BL, and the intersect connection structure shown in FIG. 2A is periodically disposed between the memory cell array MCA and the sense amplifier 10. Thus, a lower layer wire DL 8 is disposed at every eighth in the X-direction of the circuit side wires AL, and connects a circuit side wire AL8 and a transistor TR1.

In this example, although the lower layer wire DL8 has the maximum length in the lower layer wires DH and DL, the embodiment is not limited thereto. For example, it is possible to provide a layout in which a lower layer wire DH having the longest length is connected on the drain side to a transistor TR4 by changing the layout of the bit lines BL and the circuit side wires AL shown in FIG. 2B.

Figure 3A:
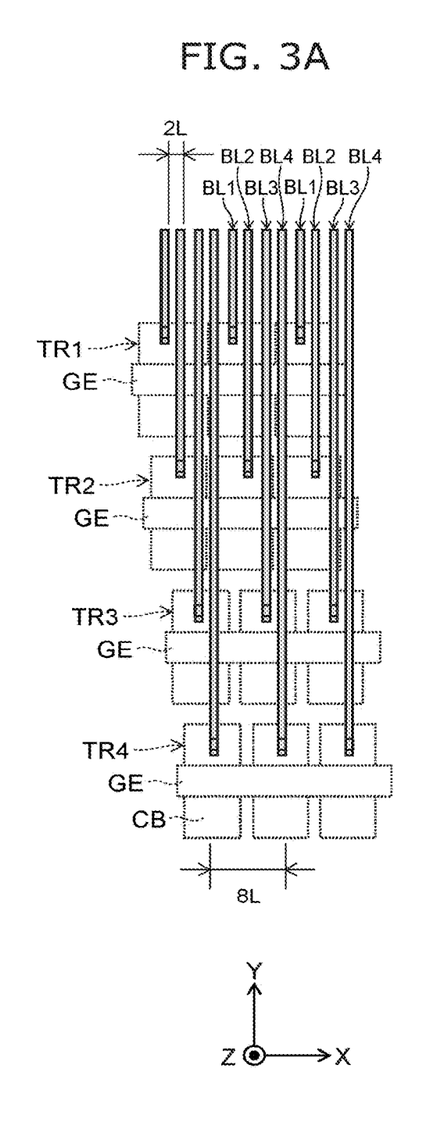
FIGS. 3A and 3B are schematic views showing a layout pattern according to a first comparable example.
Figure 3B:
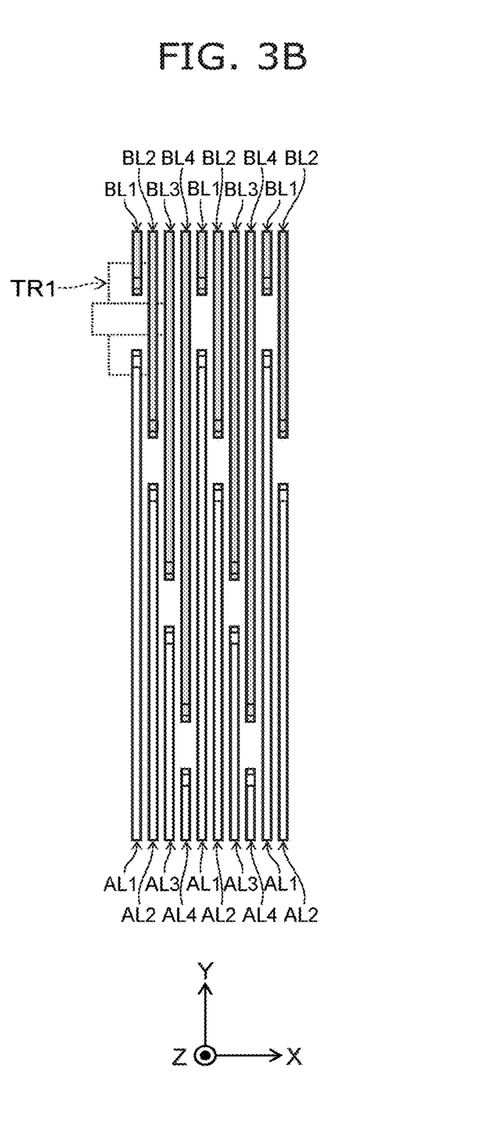
Figure 4A:
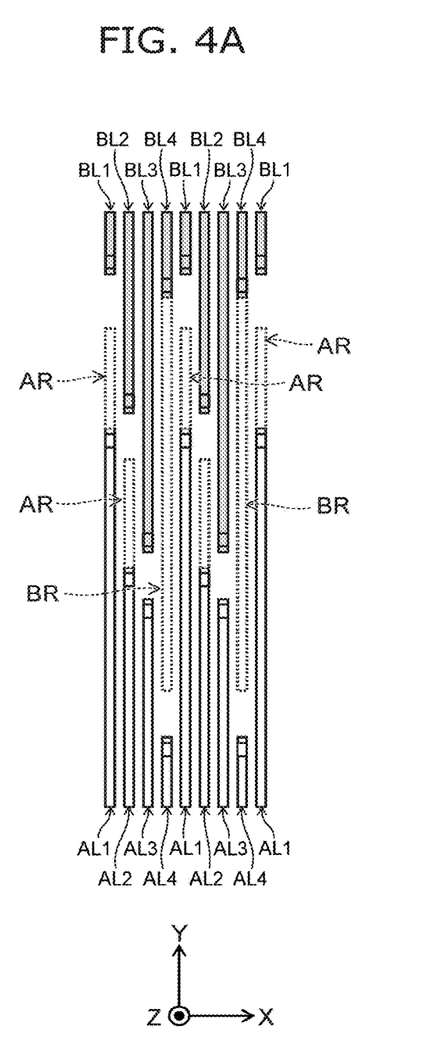
FIGS. 4A and 4B are schematic views showing a layout pattern according to a second comparable example.
Figure 4B:
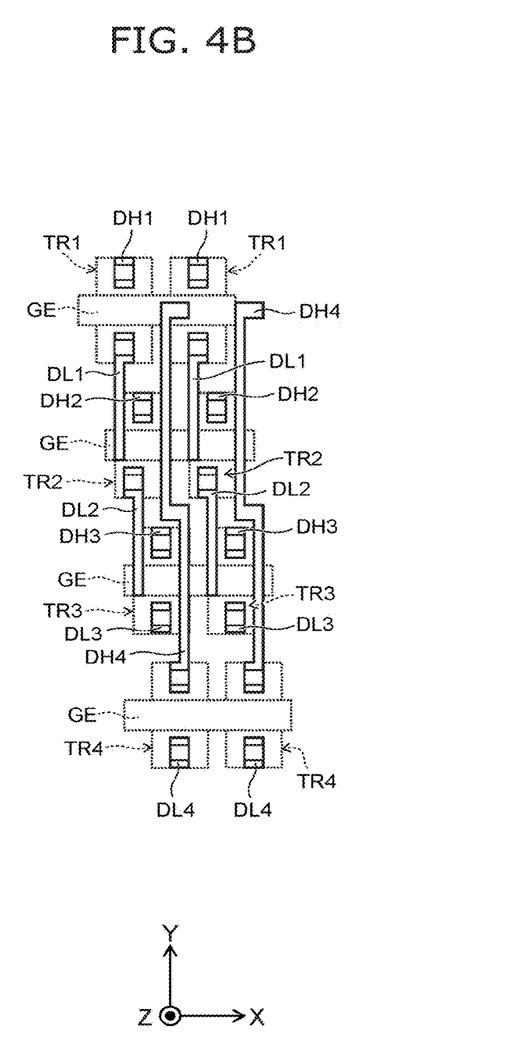

Hereinafter, a connection manner of bit lines BL and circuit side wires AL according to a comparative example is described with reference to FIGS. 3A to 4B. FIG. 3A is a schematic view showing a layout of bit lines BL and transistors TR. FIGS. 3B and 4A are schematic views showing exemplary layout patterns of the bit lines BL. FIG. 4B is a schematic view showing a layout of lower layer wires DH, DL and transistors TR.

For example, as an integration degree of the memory cell array MCA is advanced, the bit lines BL becomes thinner and a distance therebetween becomes narrower. On the other hand, it is difficult to reduce a size of the transistors TR. For example, when a width of bit line BL in the X-direction and a distance between adjacent bit lines BL in the X-direction are set to be "1F", the arrangement pitch of bit lines BL is "2F". In contrast, an arrangement pitch of the transistors TR is, for example, "8F". In such a case, the transistors TR1 to TR4 are arranged at positions sequentially shifted along the extending direction of the bit lines (the Y-direction). Thereby, it is possible to dispose the transistors TR at the connectable positions respectively with respect to the bit lines BL.

Hereinafter, in this specification, the "arrangement pitch" is defined to be a distance between center lines of the two bit lines BL being adjacent to each other and between center lines of the transistors TR disposed to be adjacent to each other respectively. It is also defined for other elements in the same manner.

In the layout shown in FIG. 3A, a plurality of transistors TR1 are disposed at a first stage on the memory cell array MCA side; a plurality of transistors TR2 are disposed at a second stage; a plurality of transistors TR3 are disposed at a third stage; and a plurality of transistors TR4 are disposed at a fourth stage. The transistors TR arranged in the X-direction, for example, share one gate electrode GE. A channel body CB of each transistor has a rectangular shape extending in the Y direction, and is arranged in the X-direction. The arrangement pitch of each transistor TR in the X-direction is "8F".

In contrast, the bit lines BL are arranged in the X-direction with the arrangement pitch of "2F", and then, are electrically connected to the transistors TR1 to TR4 respectively on the drain side. As shown, by disposing the transistors TR1 to TR4 at positions sequentially shifted in the Y-direction, it is possible to connect the transistors TR1 to TR4 and the bit lines BL which are arranged with a pitch different from the arrangement pitch of the transistors TR1 to TR4. The number of stages in the arrangement of the transistors TR, for example, is a value of the arrangement pitch thereof divided by the arrangement pitch of the bit lines BL in the same direction.

FIG. 3B is a schematic view showing a layout pattern of the bit lines BL1 to BL4 and the circuit side wires AL1 to AL4. The bit lines BL1 to BL4 and the circuit side wires AL1 to AL4 are periodically arranged in the X-direction. The bit line BL1 and the circuit side wire AL1 are electrically connected via the transistor TR1. The bit line BL2 and the circuit side wire AL2 are electrically connected via the transistor TR2. In the same manner, the bit lines BL3 and BL4 are electrically connected to the circuit side wires AL3 and AL4 respectively via the transistor TR3 and TR4 (see FIG. 3A).

In the layout shown in FIG. 3B, a portion is formed, in which the bit lines BL and the circuit side wires AL are adjacent to each other with the minimum distance, by arranging the transistors TR1 to TR4 so as to be shifted in the Y-direction. Thus, there may be a case where a breakdown voltage between the bit lines BL and the circuit side wires AL becomes insufficient as the arrangement pitch of the bit lines is reduced for advancing an integration degree of the memory cell array MCA.

Hence, in the layout shown in FIG. 4A, parts BR of the bit lines BL and parts AR of the circuit side wires AL are removed to widen a distance between the bit lines BL and the circuit side wires AL being adjacent to each other so as to be larger than the minimum distance. Then, the parts BR of the bit lines BL and the parts AR of the circuit side wires AL are alternated with lower layer wires DH and DL shown in FIG. 4B. Thus, it is possible to improve the breakdown voltage between the bit lines BL and the circuit side wires AL.

For example, a part AR of the circuit side wire AL1 is alternated with a lower layer wire DL1 between the bit line BL1 and the circuit side wire AL1. That is, the bit line BL1 is electrically connected to the transistor TR1 on the drain side through the lower layer wire DH1, and the circuit side wire AL1 is electrically connected to the transistor TR1 on the source side through the lower layer wire DL1. In the same manner, a part AR of the circuit side wire AL2 is alternated with a lower layer wire DL2 between the bit line BL2 and the circuit side wire AL2.

Moreover, a part BR of the bit line BL4 is alternated with a lower layer wire DH4. The part BR of the bit line BL4 is the longest one in the parts BR of the bit lines BL and the parts AR of the circuit side wires AL, which are removed. Correspondingly thereto, the lower layer wire DH4 is the longest one in the lower layer wires DH and DL. The lower layer wire DH4 is longer than the shortest distance between the transistor TR1 and the transistor TR4, and electrically connects the bit line BL to the transistor TR4.

In the example shown in FIGS. 4A and 4B, the bit lines BL1 to BL4 and the circuit side wires AL1 to AL4 are disposed in an arrangement periodically repeated in the X-direction. Then, the lower layer wire DH4 is electrically connected to every fourth bit line BL in the arrangement in the X-direction.

In contrast, the bit lines BL1 to BL8 are periodically arranged in the X-direction in the example shown in FIGS. 2A to 2C, and the longest lower layer wire DL8 is electrically connected to every eighth circuit side wire AL8 in the arrangement in the X-direction. In the embodiment, the number of the longest lower layer wires DL is reduced, and makes it easy to form the layout in the second interconnect layer.

For example, a density of the lower layer wires DH and DL in the second interconnect layer becomes larger as the arrangement pitch of the bit lines BL and the circuit side wires AL becomes smaller. Moreover, it is desirable to make the distance between the lower layer wires DL and the lower layer wires DH that are biased at high potential level wider than the minimum distance between the wires. To achieve such a layout, it is desirable to reduce the number of the lower layer wires.

In the layout shown in FIG. 4B, for example, six lower layer wires DH and DL arranged in the X-direction are disposed on the drain side of two adjacent transistors TR2 (or TR3). In contrast, the number of lower layer wires is four, which are disposed on the drain side of two adjacent transistors TR2 (or TR3).

In the connection structure of bit lines BL and circuit side wires AL according to the embodiment, the bit lines BL and the circuit side wires AL are periodically arranged, and the arrangement has the periodic structure in which the minimum period includes the same number of alignments each including a bit line BL and a circuit side wire AL as two times the number of stages in the arrangement of the transistors TR. That is, the alignments including eight bit lines BL and eight circuit side wires AL are disposed repeatedly as one period in a direction crossing the extending direction of the bit lines BL and the circuit side wires AL. The eight bit lines BL and the eight circuit side wires AL are connected to a group of eight transistors that includes two transistors arranged in the X-direction and four transistors arranged in the Y-direction, Thereby, it is possible to reduce the density of lower layer wires DH and DL, and easily provide a layout thereof.

Figure 5:
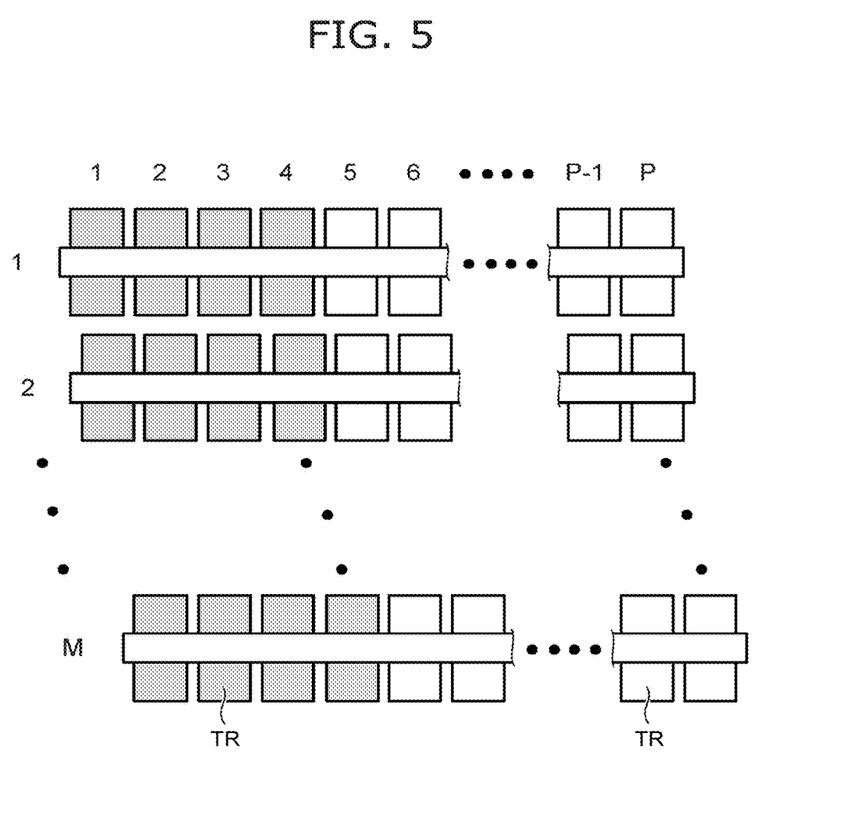
FIG. 5 is a plan view an example of a transistor arrangement according to the embodiment.

FIG. 5 is a plan view showing an exemplary arrangement of transistors TR according to the embodiment. For example, when the number of stages is set to be "M" in the arrangement of the transistors TR provided between the memory cell array MCA and the sense amplifier 10, the number of transistors arranged in an arrangement direction of bit lines BL is a value equal to the number of the bit lines BL divided by "M". When this value is set to be "P", for example, the arrangement of the bit lines BL preferably have a periodicity in which the minimum period includes alignments of M times N bit lines BL and M times N circuit side wires AL connected to a transistor group including M times N transistors (N<P, and N is a integer not less than 2). The group of M times N transistors includes N transistors of the P transistors arranged in the arrangement direction of bit lines BL. FIG. 5 shows an example of the transistor group in the case where N=4. Thereby, it is possible to connect the longest lower layer wire DH or DL, for example, to every M×N-th bit line BL or circuit side wire AL. Thus, the density of lower layer wires DH and DL is reduced, and it is possible to easily provide a layout thereof. As a result, it is possible to reduce a manufacturing cost (a cost for downsizing) of the semiconductor device.

Figure 6:
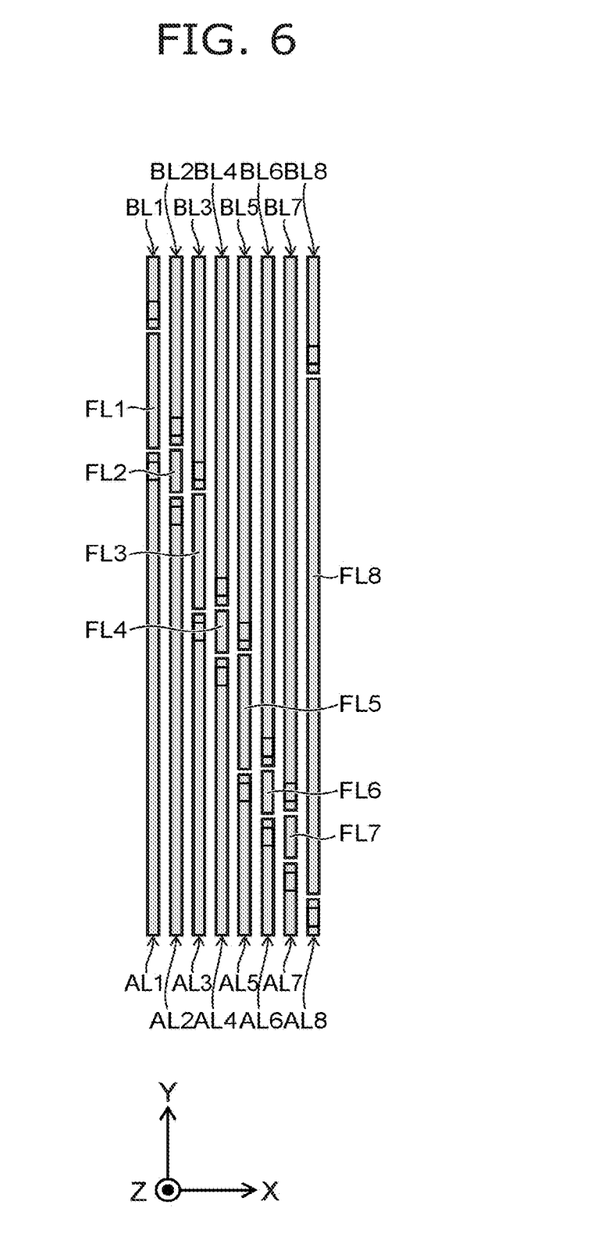
FIG. 6 is a schematic view showing a layout pattern according to a variation of the embodiment.

FIG. 6 is a schematic view showing a layout of bit lines BL and circuit side wires AL according to a variation of the embodiment. As shown in FIG. 6, unconnected wires FL1 to FL8 are disposed between the bit lines BL1 to BL8 and the circuit side wire AL1 to AL8 respectively. The wires FL1 to FL8 are not connected to any one of the bit lines BL and the circuit side wires AL, and are provided with floating potential.

In this example, it is possible to improve the breakdown voltage between the bit lines BL and the circuit side wires AL without changing a density of wires in the first interconnect layer. Thereby, it is possible to improve a manufacturing yield of the semiconductor device, for example, by easing an exposing condition in photolithography.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device, the device comprising:
   a plurality of semiconductor channel bodies;
   a plurality of memory cells disposed along each of the semiconductor channel bodies;
   a plurality of first wires electrically connected to the semiconductor channel bodies respectively, and extending in a first direction;
   a plurality of second wires provided in a first interconnect layer including the first wires, the second wires being electrically connected to a first circuit driving the memory cells, and extending in the first direction along extension lines of the first wires respectively;
   a plurality of third wires provided in a second interconnect layer different from the first interconnect layer, the third wires being electrically connected to the first wires or the second wires respectively; and
   a plurality of transistors on/off controlling electrical connections between the first wires and the second wires through the third wires,
   the first wires and the second wires being arranged respectively in a second direction crossing the first direction,
   the transistors being disposed in an arrangement including M stages (M is integer not less than 2) in the first direction, the M stages each including a transistor array aligned in the second direction, and
   the first wires and the second wires being disposed respectively in a periodic arrangement, the minimum period of the periodic arrangement including M times N first wires (N is integer not less than 2) and M times N second wires, and the M times N first wires and the M times N second wires being electrically connected to a transistor group including N transistors of the transistor array in each of the M stages.

2. The device according to claim 1, wherein the second interconnect layer is positioned at a level between the transistors and the first interconnect layer.

3. The device according to claim 1, wherein
   the third wires are electrically connected to sources or drains of the transistors respectively; and
   the first wires and the second wires are electrically connected to the transistors through the third wires respectively.

4. The device according to claim 1, wherein
   two adjacent first wires in the second direction of the first wires have a first distance; and
   a distance between each of the first wires and each of the second wires is larger than the first distance.

5. The device according to claim 4, wherein the minimum distance between one of the third wires electrically connected to any one of the first wires and other third wire electrically connected to any one of the second wires is larger than the first distance.

6. The device according to claim 1, further comprising:
   a fourth wire disposed between one of the first wires and one of the second wires, the fourth wire being aligned in the first direction with the one of the first wires and the one of the second wires, and being provided with floating potential.

7. The device according to claim 1, wherein one of the third wires connected to one of the M times N first wires and the M times N second wires included in the minimum period is connected to a transistor in a first stage or M-th stage of the transistors, and has the longest length in the third wires.

8. The device according to claim 7, wherein the one of the M times N first wires and the one of the M times N second wires electrically connected through one of the third wires that has the longest length are disposed with the largest distance in the first direction.

9. The device according to claim 7, wherein the one of the third wires having the longest length is electrically connected to one of the transistors on a source side.

10. The device according to claim 1, wherein the transistors each include a channel body extending in the first direction and a gate electrode extending in the second direction.

11. The device according to claim 1, wherein two or more transistors of the transistors disposed in a common stage share one gate electrode.

12. The device according to claim 1, wherein the transistors are disposed with an arrangement period in the second direction same as M times an arrangement period of the first wires in the second direction.

13. The device according to claim 1, wherein the first wires include two first wires electrically connected to two transistors of the transistors respectively, the two transistors being adjacent to each other in the second direction, and being disposed in a common stage.

14. The device according to claim 1, wherein the transistors are disposed between a memory cell array and the first circuit, the memory cell array including the semiconductor channel bodies and the memory cells.

15. The device according to claim 1, further comprising:
   a second circuit electrically connected to the first wires, wherein the second circuit applies high voltage to the first wires when the transistors are turned off.

16. A semiconductor memory device, the device comprising:
   a memory cell array including a plurality of semiconductor channel bodies and a plurality of memory cells disposed along each of the semiconductor channel bodies;
   a peripheral circuit provided around the memory cell array;

a transistor group disposed between the memory cell array and the peripheral circuit, the transistor group including a plurality of transistors arranged in first to M-th stages (M is integer not less than 2) disposed in a first direction from the memory cell array to the peripheral circuit, each of the stages including two transistors of the transistor group arranged in a second direction crossing the first direction;

two times M memory cell side wires extending in the first direction and electrically connected to the semiconductor channel bodies respectively, the two times M memory cell side wires being included in a first interconnect layer above the transistor group, and including first to 2M-th memory cell side wires arranged in the second direction;

two times M circuit side wires extending in the first direction and electrically connected to the peripheral circuit, the circuit side wires being included in the first interconnect layer, and including first to 2M-th circuit side wires arranged in the second direction; and a plurality of intermediate interconnects included in a second interconnect layer positioned between the first interconnect layer and the transistor group, the two times M memory cell side wires and the two tomes M circuit side wires being electrically connected to the transistors respectively via one or two of the intermediate interconnects, the first memory cell side wire and the first circuit side wire being electrically connected via one of the two transistors disposed in the first stage of transistor arrangement, the 2M-th memory cell side wire and the 2M-th circuit side wire being electrically connected via the other of the two transistors disposed in the first stage of transistor arrangement, the 2n-th memory cell side wire (n is integer 1 to M−1) and the 2n-th circuit side wire being electrically connected via one of the two transistors disposed in the n+1-th stage of transistor arrangement, and the 2n+1-th memory cell side wire and the 2n+1-th circuit side wire being electrically connected via the other of the two transistors disposed in the n+1-th stage of transistor arrangement.

17. The device according to claim 16, wherein
the first to 2M-th memory cell side wires are aligned in the first direction with the first to 2M-th circuit side wires respectively, and
a first distance between each of the first to 2M-th memory cell side wires and each of the first to 2M-th circuit side wires is larger than a second distance between the first to 2M-th memory cell side wires.

18. The device according to claim 17, wherein the 2M-th memory cell side wire and the 2M-th circuit side wire are disposed in the first interconnect layer with the maximum first distance.

19. The device according to claim 16, further comprising:
a plurality of transistor groups arranged in the second direction with the transistor group, and each including 2M transistors arranged in the same manner as the transistor group;
a plurality of memory cell side wires extending in the first direction, and electrically connected to the plurality of transistor groups in the same manner as the two times M memory cell side wires; and
a plurality of circuit side wires extending in the first direction, and electrically connected to the plurality of transistor groups in the same manner as the two times M circuit side wires.

* * * * *